United States Patent
Takahashi et al.

(10) Patent No.: US 6,171,420 B1
(45) Date of Patent: Jan. 9, 2001

(54) MANUFACTURING PROCESS OF FUNCTIONAL FILM ELEMENT

(75) Inventors: Nobuo Takahashi, Owariasahi; Tsutomu Nanataki, Toyoake, both of (JP)

(73) Assignee: NGK Insulators, Ltd. (JP)

( * ) Notice: Under 35 U.S.C. 154(b), the term of this patent shall be extended for 0 days.

(21) Appl. No.: 09/033,722

(22) Filed: Mar. 3, 1998

(30) Foreign Application Priority Data

Mar. 4, 1997 (JP) .................................................. 9-049250

(51) Int. Cl.[7] .................................................. B32B 31/26
(52) U.S. Cl. .................................... 156/89.11; 156/89.12; 156/89.16; 156/89.28
(58) Field of Search ............................. 156/89.11, 89.12, 156/89.14, 89.16, 89.17, 89.28; 347/68, 71, 72, 123; 310/328, 331

(56) References Cited

U.S. PATENT DOCUMENTS

| | | | |
|---|---|---|---|
| 5,376,856 | * 12/1994 | Takeuchi et al. | ........................ 310/328 |
| 5,512,793 | * 4/1996 | Takeuchi et al. | ........................ 310/328 |
| 5,617,127 | * 4/1997 | Takeuchi et al. | ........................ 347/71 |
| 5,643,379 | * 7/1997 | Takeuchi et al. | ........................ 347/71 X |
| 5,670,999 | * 9/1997 | Takeuchi et al. | ........................ 347/71 X |
| 5,728,244 | * 3/1998 | Nanataki et al. | ........................ 156/252 X |
| 5,733,670 | * 3/1998 | Takeuchi et al. . | |
| 5,893,954 | * 4/1999 | Nanataki et al. | ........................ 156/89.11 |

FOREIGN PATENT DOCUMENTS 0 572 230    12/1993    (EP) .
  640035     2/1994     (JP) .

* cited by examiner

*Primary Examiner*—Curtis Mayes
(74) *Attorney, Agent, or Firm*—Wall Marjama Bilinski & Burr

(57) ABSTRACT

When green sheets are laminated and integrally fired for a window spacer plate formed with at least a plurality of windows, a covering plate for covering the windows, and a through hole plate having through holes, communicating with the windows, it is arranged to make a ratio t/w of thickness t of the green sheet for the window spacer place to length w of the through holes formed in the green sheet for the through hole plate, in its minor axis direction one or more, and to form a functional film actuator on the outer surface of the covering plate after firing. A gap (separation) is prevented from being generated in the interface between each ceramics plate in producing a ceramics substrate used for the functional film element.

4 Claims, 1 Drawing Sheet

MANUFACTURING PROCESS OF FUNCTIONAL FILM ELEMENT

BACKGROUND OF THE INVENTION AND RELATED ART STATEMENT

The present invention relates to a manufacturing process of a functional film element, and, more particularly, to a manufacturing process of a functional film element suitably used for a fluid sensor, a temperature sensor, a fluid pump, a speaker, an actuator, a transducer or the like.

In recent years, there has been known a functional film element utilizing an energy conversion function of a functional film, in which a cavity is formed in a substrate, and a functional film actuator is mounted on the outer surface of the cavity, whereby the functional film actuator senses change of physical variable such as pressure or temperature occurring in the cavity, and outputs an electric signal corresponding to the variation of that physical variable. A functional film element utilizing such characteristics for converting variation of various physical variables into an electric signal is generally called a functional film sensor or a functional filter.

Contrary to the above, when an electric signal (voltage or current) is applied to such functional film element, the functional film actuator generates mechanical stress such as expansion and contraction, bending or vibration in the cavity according to the applied voltage or current, or generates heat so that it acts as a heater or the like for heating inside the cavity.

FIG. 4 shows an example of structure of a conventional functional film element 14 or a sensor. A functional film element 14 is constituted by providing through holes 2 and 3 to input the variable to be measured, forming in a ceramics substrate 9 a cavity 1 which is a measurement area, and integrally forming a functional film actuator 13 on a covering plate 6 for the external wall positioned opposite to the through holes 2 and 3 in the cavity 1. Here, the ceramics substrate 9 is integrally formed by laminating the covering plate 6 and a through hole plate 8 having the through holes 2 and 3 passing into the cavity 1, each of which is a very thin plate, with a window spacer plate 7 therebetween. The through holes are not limited to the through holes 2 and 3, but a through hole 4 or other through holes are provided depending on an object to increase contact points with the external environment.

The window spacer plate 7 is formed with a window 5 in such a manner that three through holes 2, 3 and 4 provided in the through hole plate 8 are formed in a longitudinal extent of the window 5 so that these holes are opened toward the window 5. In addition, a very thin covering plate 6 is laminated on a surface opposite to the side on which the through hole plate 8 of the window spacer plate 7 is laminated to cover and close the window 5, thereby forming the cavity 1 within the ceramics substrate 9.

Then, the ceramics substrate 9 is provided with the functional film actuator 13 on the outer surface of the covering plate 6 at a position corresponding to the cavity 1. Here, the functional film actuator 13 consists of a lower electrode 12, a functional film layer 11, and an upper electrode 10.

The conventional functional element 14 is arranged as above, in which, viewing the cavity 1 and the through holes 2, 3 and 4 in a plan view, the cavity 1 overlaps over the through holes 2, 3 and 4 as shown in FIG. 5. On the other hand, in recent years, as seen in a plan view of FIG. 2 showing a positional relationship between a window 29, and through holes 22, 23 and 24, there has been employed, to enhance detection accuracy of the functional film element, a shape in which through holes, for example, 22 and 23 out of those formed in the ceramics substrate are longitudinally elongated in a cavity 21 (window 29).

However, in actually manufacturing a functional film element to have the through holes 22 and 23 outwardly elongated from the outer edge of the cavity 21 (window 29), when ceramics green sheets are laminated and integrated under pressure, the through holes 22 and 23 provided through a window spacer plate 26 and a through hole plate 27 prevent transmission of pressure through each green sheet in the laminating direction, thereby making it difficult to apply sufficient pressing pressure, and sufficient adhesion cannot be obtained. Consequently, there is a problem in that a covering plate 25 and a window spacer plate 26 are separated at an adhered section between them facing the window 21 to generate a gap 41 after firing as shown in FIG. 3.

Generation of such gap 41 is unfavorable since when the functional film element is used as a pressure measuring sensor, air is left in the cavity when fluid to be measured for pressure is intended to be filled in the cavity to provide a pressure measurement error. In addition, when it is used as a temperature sensor, in measuring temperature of fluid such as liquid, air left in the gap frequently has thermal capacity different from that of the liquid, and the air causes delay of measurement accurately following temperature variation of the liquid. In addition, when it is used for a speaker, mechanical stress is imposed on the covering plate 25 due to vibration of the functional film element. This causes separation of the covering plate 25 or the like to proceed with the gap 41 as a starting point of breakage. As a result the speaker will break.

SUMMARY OF THE INVENTION

The present invention is made in view of the problems as described above, and the object of the present invention is to provide a process of manufacturing a functional film element in which through holes are elongated outward from a cavity, wherein gap is generated between a covering plate and a window spacer plate.

To attain the above object, according to the present invention, there is provided a process of manufacturing a functional film element, which comprises the steps of:

placing a covering plate on one side of a window spacer plate, which is provided with at least one window, to cover and close the window;

placing a through hole plate with through holes on the other side of the window spacer plate so that at least parts of said through holes communicate with the window, and the through holes are elongated outward from the window;

laminating and integrally firing green sheet of each of the plates in such a manner that a ratio t/w of thickness t of the window spacer plate to width w of the through hole in its minor axis direction is one or more; to produce a ceramics substrate formed with a cavity in which the through holes communicate with the window; and forming a functional film on the outer surface of the covering plate.

In the process of manufacturing a functional film element, the through hole is preferably formed with a width of 300 μm or less in the direction of minor axis in the green sheet for the through hole plate. The through hole preferably has a shape of elongated circle, oval or rectangular.

According to the process of manufacturing a functional film element according to the present invention, a gap is prevented from being generated at an interface between the covering plate and the window spacer plate in producing the ceramics substrate of the functional film element, thereby a functional film element being provided with excellent detection accuracy and mechanical properties.

Here, the functional film herein specifically means a dielectric film, a thermoelectric element film, a piezoelectric/electrostrictive film, a varistor film, or a film consisting of only electrodes.

PREFERRED EMBODIMENTS OF THE INVENTION

Now, the present invention is described in detail, but not limited to the following embodiment.

Figure 1:
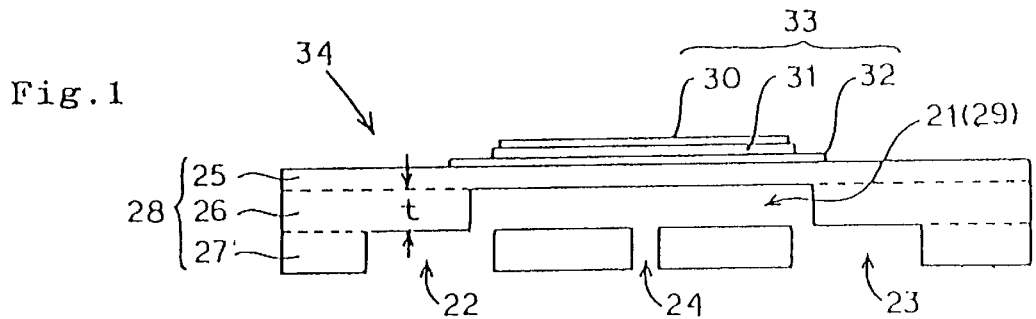
FIG. 1 is a sectional view of a functional film element according to the present invention.

FIG. 1 is a sectional view showing an embodiment of a functional film element 34 produced by the manufacturing process of the present invention. The functional film element 34 comprises a ceramics substrate 28, and a functional film actuator 33 integrally formed on the ceramics substrate 28. The ceramics substrate 28 is arranged by integrally laminating a covering plate 25 and a through hole plate 27 formed with through holes 22, 23 and 24 with a window spacer plate 26 therebetween, each these plate being a very thin plate.

The window spacer plate 26 is formed with at least one window 29. The window spacer plate 26 is laminated on the through hole plate 27 in such a manner that the through holes 22 and 23 formed in the through hole plate 27 partially overlap and open toward these windows 29 in the window spacer plate 26, and the through hole 24 completely communicates with the window 29. Therefore, the positional relationship between the window 29 and the through holes 22, 23 and 24 can be shown in a plan view same as FIG. 2. In addition, the covering plate 25 is placed on the surface opposite to the side where the window spacer plate 26 and the through hole plate 27 are laminated to cover and close an opening of the window 29 with the covering plate 25. As a result, a cavity 21 is being formed inside the ceramics substrate 28.

Figure 2:
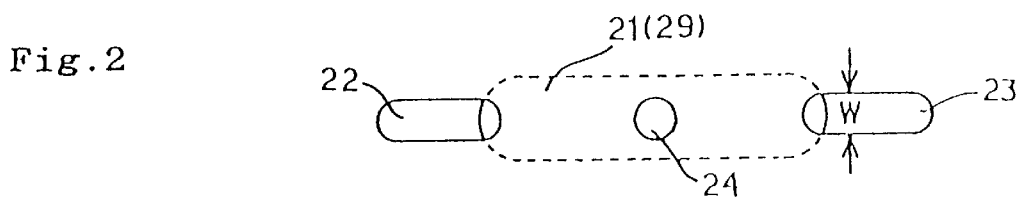
FIG. 2 is a plan view showing a positional relationship between communicating holes and a cavity of a functional film element according to the present invention.
Figure 3:
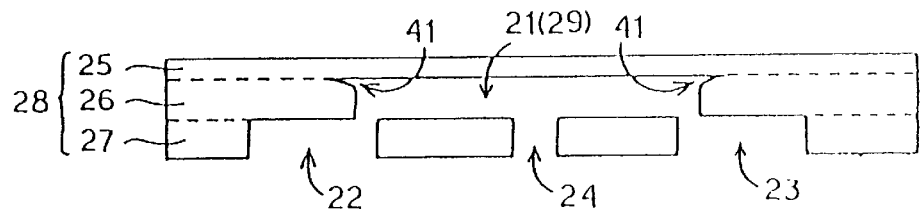
FIG. 3 is a sectional view showing how a gap is generated, the gap being a problem to be solved by the present invention.
Figure 4:
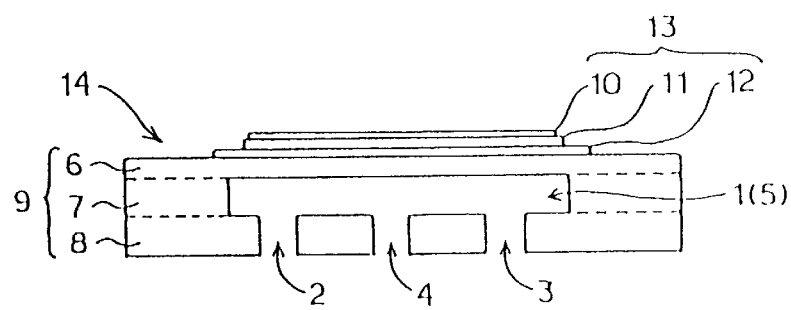
FIG. 4 is a sectional view of a conventional functional film element.
Figure 5:
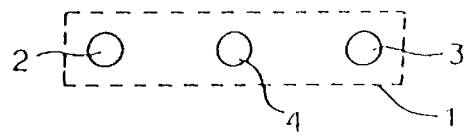
FIG. 5 is a plan view showing a positional relationship between communicating holes and a cavity of a conventional functional film element.

In producing such functional film element 34, it is preferable to make one or more a ratio t/w of thickness t of a green sheet for the window spacer plate 26 to width w of each of the through holes 22 and 23 formed in a green sheet for the through hole plate 27 in its minor axis direction (as shown in FIG. 2), and particularly to make 300 µm or less the width w of each of the through hole 22 and 23. When the green sheets are laminated and integrated under pressure, such conditions suppress prevention of pressure transmission in the laminating direction of the green sheets caused by the window spacer plate 26 and the through holes 22 and 23 formed in the through hole plate 27, whereby a gap 41 is prevented from being generated by peeling in the adhered portion facing the cavity 21 between the covering plate 25 and the window spacer plate 26 after firing. However, if the width w of each of the through holes 22 and 23 in the minor axis direction exceeds 300 µm, integration through lamination of green sheets becomes difficult to maintain at some portion between the covering plate 25 and the window spacer plate 26. As a result the gap 41 tends to be generated, even if the t/w value is set within a range of limit of one or more.

Therefore, in the present invention, because the width in the minor axis direction is limited, the through holes 22 and 23 preferably have an elongated circular shapes (i.e., elliptical) in a plan view as shown in FIG. 2, as well as a rectangular or oval. In addition, the hole may have a shape in which the shape is modified at its ends in the major axis direction to have a polygonal shape, or may be a polygon elongated in one direction. While the conditions for forming the through hole 24 preferably follows those for the through holes 22 and 23, the through hole 24 need not entirely communicate with the cavity 21 as shown in FIG. 1, and may be formed in the same manner as the through holes 22 and 23. In addition, the plane shape of the cavity 21 is not limited to the elongated circle shown in FIG. 2, but may have various shapes.

In the present invention, the ceramics substrate 28 described above is formed as a one-piece sintered article of ceramics. Specifically, a green sheet is molded from ceramics slurry prepared from a ceramics material, binder and solvent by a conventional device such as a doctor blade or calendar roll. Then, the green sheet is processed through cutting, grinding, or stamping, as necessary, to produce precursors of respective plates formed with the window 29, the through holes 22, 23, and 24. These precursors are laminated, integrated under pressure (while heating, if necessary), and sintered, so that an integrated ceramics substrate 28 is produced. Materials used for constituting the ceramics substrate 28 favorably include alumina and zirconia in view of mechanical properties and moldability, but are not specifically limited. It is also preferred that the produced green sheets have substantially equal firing shrinkage ratio. It is because, if the firing shrinkage ratio significantly differs from one green sheet to another, the ceramic substrate 28 suffers from separation of sheets or deformation in firing.

Then, the ceramics substrate 28 is provided with a functional film layer 31 of a functional film actuator 33 on the outer surface of the covering plate 25 to cover a part of the plane shape of the cavity 21. Here, the functional film actuator 33 comprises a lower electrode 32, the functional film layer 31, and the upper electrode 30. These members may be usually formed by various conventional film formation processes such as thick film formation processes including screen printing, spraying, or slurry coating, or thin film formation processes including ion beam, sputtering, or chemical vapor deposition (CVD).

Each film of the thus formed functional film actuator 33 (lower electrode 32, functional film layer 31, and upper electrode 30) is then subject to heat treatment (firing). Such heat treatment may be performed every time each film is formed, or in batch after all films are formed. However, in sequential firing, it is preferred that heat treatment temperature in the later process is equal to or lower than that in the previous process. This is because, if the treatment temperature of the later process is higher than that of the previous process, the film burnt in the previous process is also sintered in the later process, leading to possible peeling or aggregation due to over sintering.

Materials for the lower and upper electrodes 32 and 30 constituting the functional film actuator 33 are not limited to any particular materials as long as they are conductors which can withstand temperature and atmosphere in forming respective films. Generally used are metals, alloys or conductive ceramics. More specifically, favorable materials are precious metals with high melting point including platinum, gold, palladium, and silver-palladium alloy.

In addition, various functional ceramics, functional polymers, or metal materials can be used as materials for the functional film actuator 31 constituting the functional film actuator 33 depending on their applications. For example, materials favorably used are iron (Fe)-silicon (Si) type intermetallic compounds or the like for the thermoelectric element, zinc oxide (ZnO) or the like for the varistor element, or lead zirconium acid titanate (PZT), or plumbum magnesium niobate (PMN) or plumbum nickel niobate (PNN) for the materials exhibiting electric field induced distortion such as piezoelectric or electrostrictive effect.

The functional film element 34 thus produced may be provided with only one electrode layer on the covering plate 25. In such case, the ceramics substrate 28 including the covering plate 25 may be produced from various functional materials used for the functional film layer 31.

In addition, the thickness of the functional film actuator 33 is typically 100 $\mu$m or less, the thickness of the lower and upper electrodes 32 and 30 is typically 20 $\mu$m or less, preferably, 5 $\mu$m or less, and the thickness of the functional film layer 31 is preferably 50 $\mu$m or less, more preferably, 3 $\mu$m or more but 40 $\mu$m or less to obtain higher potential at a low operating voltage.

While an embodiment of the present invention has been described in detail in the above, it is should be noted that the present invention is never limited by such embodiment. In addition, it should be understood that, in addition to the above embodiment, the present invention may be practiced with various variations, modifications or improvements without departing from the spirit thereof based on the knowledge of those skilled in the art.

As described above, the present invention enables it to produce a functional film element having fluid channel with through holes elongated from a cavity without generating any gap, whereby a functional film element with higher detection accuracy than the prior art can be provided.

What is claimed is:

1. A process of manufacturing a functional film element, which comprises the steps of:

placing a covering plate on one side of a window spacer plate, which is provided with at least one window, to cover and close said window;

placing a through hole plate with through holes on the other side of said window spacer plate so that at least parts of said through holes communicate with said window, and said through holes are elongated outward from said window;

laminating and integrally firing the green sheets of said plates in such a manner that a ratio t/w of thickness t of the green sheet for said window spacer plate to width w of said through hole formed in the green sheet for said through hole plate in its minor axis direction is one or more, to produce a ceramics substrate formed with a cavity in which said through holes communicate with said window; and forming a functional film on the outer surface of said covering plate.

2. The process of manufacturing a functional film element as set forth in claim 1, wherein said through hole has a width of 300 $\mu$m or less in the direction of minor axis.

3. The process of manufacturing a functional film element as set forth in claim 1, wherein said through hole provided on said through hole plate has a shape selected from the group consisting of elongated circle, oval and rectangular.

4. The process of manufacturing a functional film element as set forth in claim 2, wherein said through hole provided on said through hole plate has a shape selected from the group consisting of elongated circle, oval and rectangular.

* * * * *